United States Patent
Adams et al.

(10) Patent No.: US 9,645,905 B2
(45) Date of Patent: May 9, 2017

(54) MEMORY TYPE DESIGNATION AND/OR VERIFICATION SYSTEM

(71) Applicant: LENOVO ENTERPRISE SOLUTIONS (SINGAPORE) PTE. LTD., Singapore (SG)

(72) Inventors: Keith T. Adams, Cary, NC (US); Edward S. Suffern, Chapel Hill, NC (US); Mike Y. Zhu, Apex, NC (US)

(73) Assignee: LENOVO ENTERPRISE SOLUTIONS (SINGAPORE) PTE. LTD., Singapore (SG)

( * ) Notice: Subject to any disclaimer, the term of this patent is extended or adjusted under 35 U.S.C. 154(b) by 119 days.

(21) Appl. No.: 14/661,730

(22) Filed: Mar. 18, 2015

(65) Prior Publication Data

US 2016/0276785 A1 Sep. 22, 2016

(51) Int. Cl.
*G06F 11/27* (2006.01)
*G11C 5/04* (2006.01)
*G11C 7/20* (2006.01)
*G11C 29/04* (2006.01)

(52) U.S. Cl.
CPC ............... *G06F 11/27* (2013.01); *G11C 5/04* (2013.01); *G11C 7/20* (2013.01); *G11C 2029/0407* (2013.01)

(58) Field of Classification Search
None
See application file for complete search history.

(56) References Cited

U.S. PATENT DOCUMENTS

| | | | |
|---|---|---|---|
| 2002/0010835 A1* | 1/2002 | Post | G06F 13/4081 711/115 |
| 2002/0129186 A1* | 9/2002 | Emerson | G06F 13/4081 710/302 |
| 2005/0028068 A1* | 2/2005 | Larson | G06F 11/326 714/764 |
| 2006/0168422 A1* | 7/2006 | Rippens | G11O 5/04 711/207 |
| 2012/0001763 A1* | 1/2012 | Billick | G06F 15/177 340/635 |

\* cited by examiner

*Primary Examiner* — Leon-Viet Nguyen
(74) *Attorney, Agent, or Firm* — Jason Friday; Andrew M. Calderon; Roberts Mlotkowski Safran Cole & Calderon, P.C.

(57) ABSTRACT

A memory DIMM (dual in-line memory module) installation verification system for a server system is provided. The system includes a bank of memory slots including a plurality of memory sockets. The system further includes a circuit including wiring connecting at least one switch to each of the memory sockets with direct connections to respective lights within a bank of lights associated with each of the plurality of memory sockets.

20 Claims, 7 Drawing Sheets

MEMORY TYPE DESIGNATION AND/OR VERIFICATION SYSTEM

FIELD OF THE INVENTION

The invention relates to a memory verification system and, more particularly, to a memory DIMM (dual in-line memory module) installation verification system for a server system.

BACKGROUND

Functionality issues may occur if mixed memory types are installed in the same server system. For this reason, manufacturers of servers do not test, recommend, or support mixing of memory types within the same server system. Instead, manufacturers recommend that memory modules of identical size, type, banking and stacking technology, and vendor are installed in each server system.

However, when installing memory DIMMs in a server, there is a potential for installing the wrong DIMMs in a memory DIMM slot. For example, memory DIMMs can be mistakenly installed in the incorrect memory channel resulting in a malfunction of the server system.

SUMMARY

In an aspect of the invention, a system comprises a bank of memory slots comprising a plurality of memory sockets. The system further comprises a circuit comprising wiring connecting at least one switch to each of the memory sockets with direct connections to respective lights within a bank of lights associated with each of the plurality of memory sockets.

In an aspect of the invention, a system comprises: a plurality of memory sockets; a bank of lights adjacent to each of the memory sockets of the plurality of memory sockets; and a circuit comprising wiring connecting at least one switch to each of the memory sockets with direct connections to each of the lights within the bank of lights. Each light in each bank of lights designates a parameter of a memory plugged into a memory socket of the plurality of memory sockets, and the wiring connects lights across the bank of lights such that upon insertion of memory into one memory socket of the plurality of memory sockets, a same type of light in each of the bank of lights illuminates.

In an aspect of the invention, a system comprises: a plurality of memory sockets corresponding to a bank of memory; a plurality of lights adjacent to each of the memory slots of the plurality of memory slots, wherein each light of the plurality of lights corresponds to a parameter of a memory plugged into each memory socket of the plurality of memory sockets; and a circuit comprising at least one switch and wiring. The wiring: connects the at least one switch to each of the memory sockets; connects each of the memory sockets to each of the lights of the plurality of lights adjacent to the memory socket; and connects lights across different memory slots, which designate a same memory parameter. A particular set of lights illuminate when a dual in-line memory module (DIMM) plugged into a memory socket of the plurality of memory sockets has a certain characteristic or parameter that matches to the set of lights.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to a memory verification system and, more particularly, to a memory DIMM (dual in-line memory module) installation verification system for a server system. More specifically, the present invention provides a system and method to verify that memory, e.g., DIMMs, are installed correctly in a server system, prior to power on testing by a manufacturer. Accordingly and advantageously, the systems and methods described herein ensure that memory modules of identical size, type, banking and stacking technology, and/or vendor are installed in a server system thereby eliminating any potential functionality issues which can otherwise result in mixed memories installed in the same server system. Also, the systems and methods described herein save manufacturing time by checking for the proper DIMM population prior to the first power on. This technique can also be used in the field for any upgrades.

In more specific embodiments, the systems and methods described herein are configured to highlight where memory need to be populated within a server system using circuitry connecting to a lighting system. By using certain lighting schemes of the lighting system, as described herein, it is now possible to verify that the memory, e.g., DIMMs, population sequence is correct prior to applying AC power to the server planar at the manufacturer. Said otherwise, the systems and methods described herein can visually show an incorrect memory configuration, which can result in server functionality issues. For example, verification of DIMMs being correctly plugged into their connectors is provided when only a single light (e.g., LED) next to each DIMM socket is illuminated. On the other hand, when two LEDs are illuminated, then an incorrect or mismatched DIMM has been installed providing an indication to the installer that a different DIMM needs to be installed.

Figure 1:
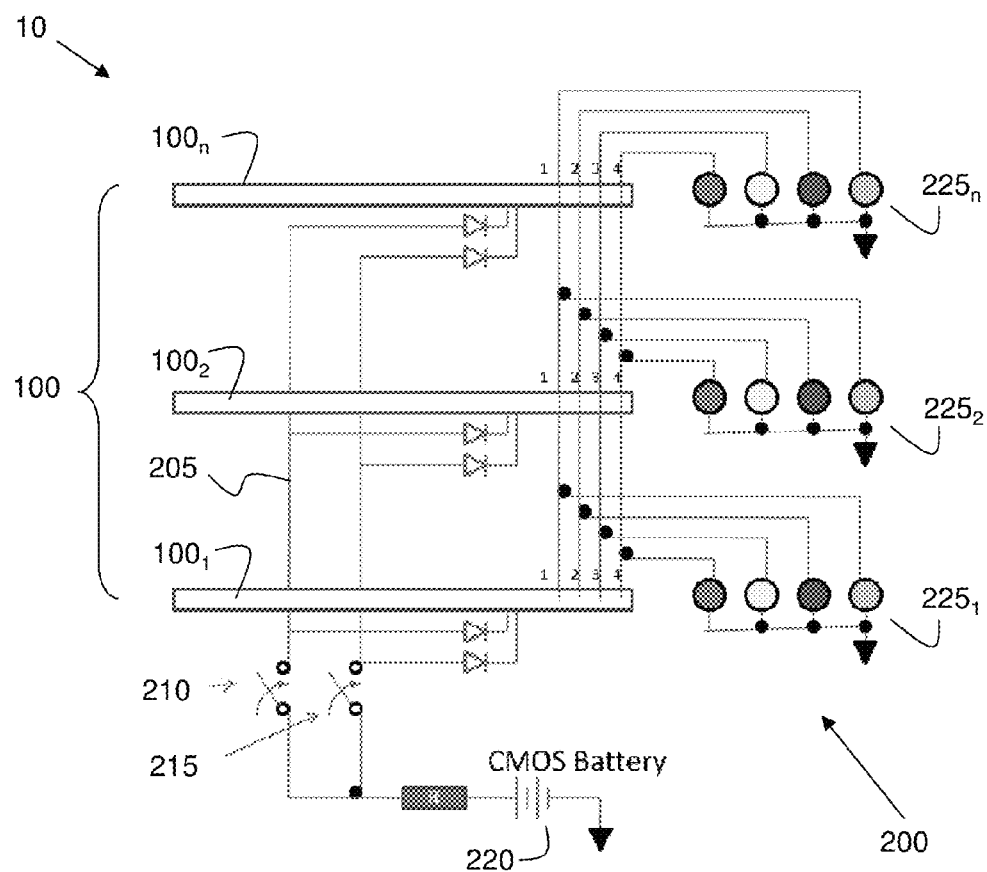
FIG. 1 shows an overview of a memory installation verification system used in a server system in accordance with aspects of the invention.

FIG. 1 shows an overview of a memory installation verification system used in a server system in accordance with aspects of the invention. In embodiments, the memory installation verification system 10 comprises a bank of memory slots 100 with a plurality of memory sockets, e.g., memory DIMM sockets, $100_1$, $100_2$ and $100_n$. Although the memory installation verification system 10 of FIG. 1 is shown with only a single memory bank and three memory sockets, one of ordinary skill in the art should understand that the memory installation verification system 10 can have multiple memory banks with any number of memory sockets interposed, for example, with the memory bank 100 described herein. For ease of discussion, though, only a single memory bank 100 with three memory sockets $100_1$, $100_2$ and $100_n$ will be discussed herein.

Still referring to FIG. 1, the memory installation verification system 10 further comprises a circuit designated at reference 200. In embodiments, the circuit 200 is designed and configured to verify that DIMMs plugged into any of the respective memory sockets $100_1$, $100_2$ and $100_n$ are of a same type, e.g., size, speed, banking, etc. The circuit 200 includes wiring 205, which connects switches 210, 215 to each of the memory sockets $100_1$, $100_2$ and $100_n$ with direct connections to a respective bank of grounded lights $225_1$, $225_2$ and $225_n$.

Still referring to FIG. 1, the switches 210, 215 can be, e.g., push button switches or other types of switches as contemplated by the invention. In embodiments, the switch 210 can be used to verify a "size" of the DIMM; whereas, the switch 215 can be used to verify a "speed" of the DIMM, as described further herein. In embodiments, each bank of lights $225_1$, $225_2$ and $225_n$ includes four lights, e.g., LEDs, powered by a battery 220 (e.g., CMOS battery). Each light in the bank of lights $225_1$, $225_2$ and $225_n$ is preferably of a different color connected to a respective wire 1, 2, 3, 4 of the wiring 205. In specific embodiments, each light can be used to (i) designate a specific characteristic/parameter of the DIMM as shown in Tables 1 and 2, for example, and (ii) whether multiple DIMMs plugged into the memory sockets $100_1$, $100_2$ and $100_n$ are of a same type, e.g., speed, size or other parameter as described in FIGS. 4-6. Although two switches and four lights are shown for each bank of grounded lights $225_1$, $225_2$ and $225_n$, it should be understood that, in practice, the number of lights (LEDs) can be increased and switches can be added in order to verify additional parameters of the DIMM installation.

In more specific embodiments, as shown in FIG. 1, each wire, 1, 2, 3, 4 of the wiring 205 is connected to each of the memory sockets $100_1$, $100_2$ and $100_n$ and a respective light in each bank of grounded lights $225_1$, $225_2$ and $225_n$. More specifically, each wire 1, 2, 3, 4 is connected to a respective same type light (e.g., color) across the bank of lights $225_1$, $225_2$ and $225_n$, for example, wire 1 is connected to each first light (e.g., of same color) of the bank of lights $225_1$, $225_2$ and $225_n$, etc. In this way, the illumination of one light associated with wire 1, for example, would result in an illumination of each light connected to wire 1, upon power up, switching on one of the switches 210, 215 and insertion of a DIMM into a single memory socket $100_1$, $100_2$ and $100_n$.

Tables 1 and 2, below, show exemplary DIMM characteristics/parameters matched to a respective lighting color used with the bank of lights $225_1$, $225_2$ and $225_n$. More specifically, Table 1 shows the speed of the DIMM as represented by a specific light color in the memory installation verification system 10; whereas, Table 2 shows the size of the DIMM as represented by a specific light color in the memory installation verification system 10. It should be understood that similar tables with the same or different colors can be used to show other DIMM characteristics/parameters such as ranking, buffered/unbuffered, CAS/RAS, latency, etc.

TABLE 1

| DIMM speed | Green | Yellow | Blue | Orange |
| --- | --- | --- | --- | --- |
| 1066 MHz | X | | | |
| 1333 MHz | | X | | |
| 1666 MHz | | | X | |
| 2133 MHz | | | | X |

TABLE 2

| DIMM Size | Green | Yellow | Blue | Orange |
| --- | --- | --- | --- | --- |
| 4 GB | X | | | |
| 8 GB | | X | | |
| 12 GB | | | X | |
| 16 GB | | | | X |

FIGS. 2-6 show different operating states of the memory installation verification system 10 in accordance with aspects of the invention. As described with reference to FIGS. 2-6, it is important designate and verify that a same memory type (i.e., identical size, speed, etc.) within the same server system is being used, as it is well recognized that functionality issues may occur if mixed memory types are installed in the same server system.

Figure 2:
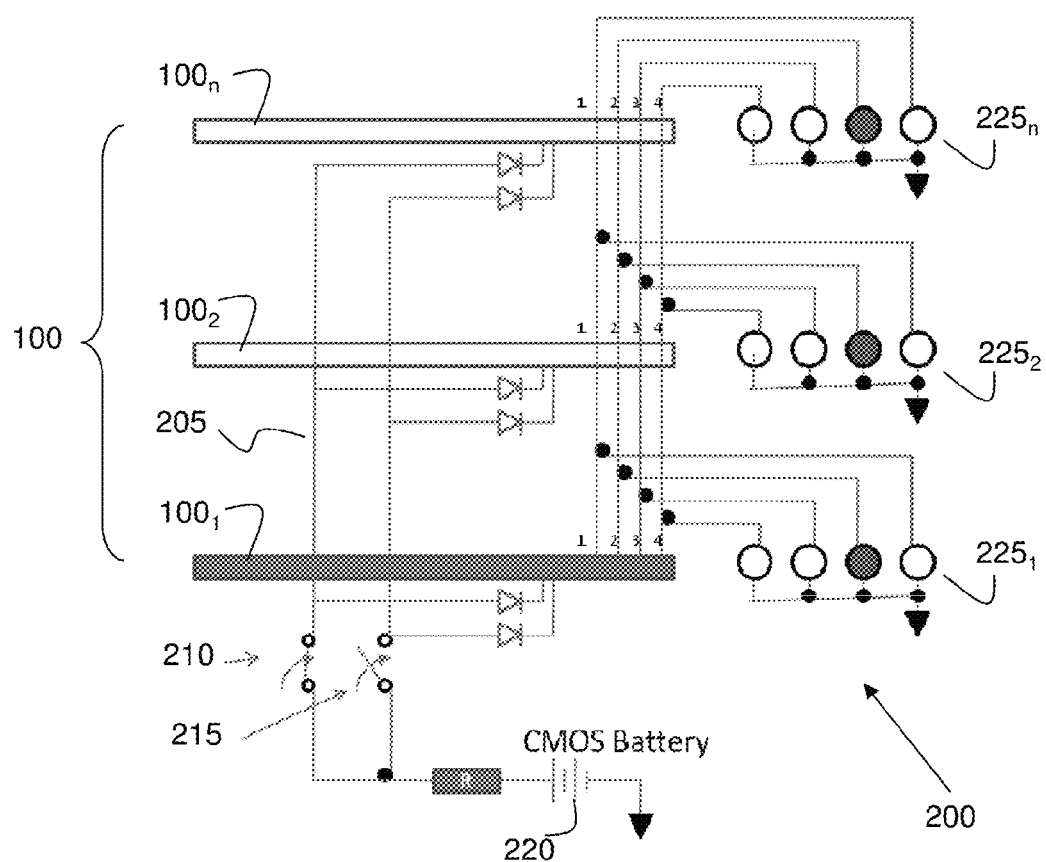
FIG. 2 depicts the memory installation verification system when a first switch is activated and a DIMM is inserted into a memory socket in accordance with aspects of the invention.

More specifically, FIG. 2 depicts the memory installation verification system 10 when the size switch 210 is activated and a single DIMM is inserted into the memory DIMM socket $100_1$. In this operational state, a single DIMM plugged into the memory DIMM socket $100_1$ will result in an illumination of a single light in each lighting bank $225_1$, $225_2$ and $225_n$. In accordance with aspects of the invention, the illumination of a single light (of a same color) in each lighting bank $225_1$, $225_2$ and $225_n$ will designate a specific characteristic/parameter (i.e., size) of the DIMM as shown, for example, in Table 1.

Figure 3:
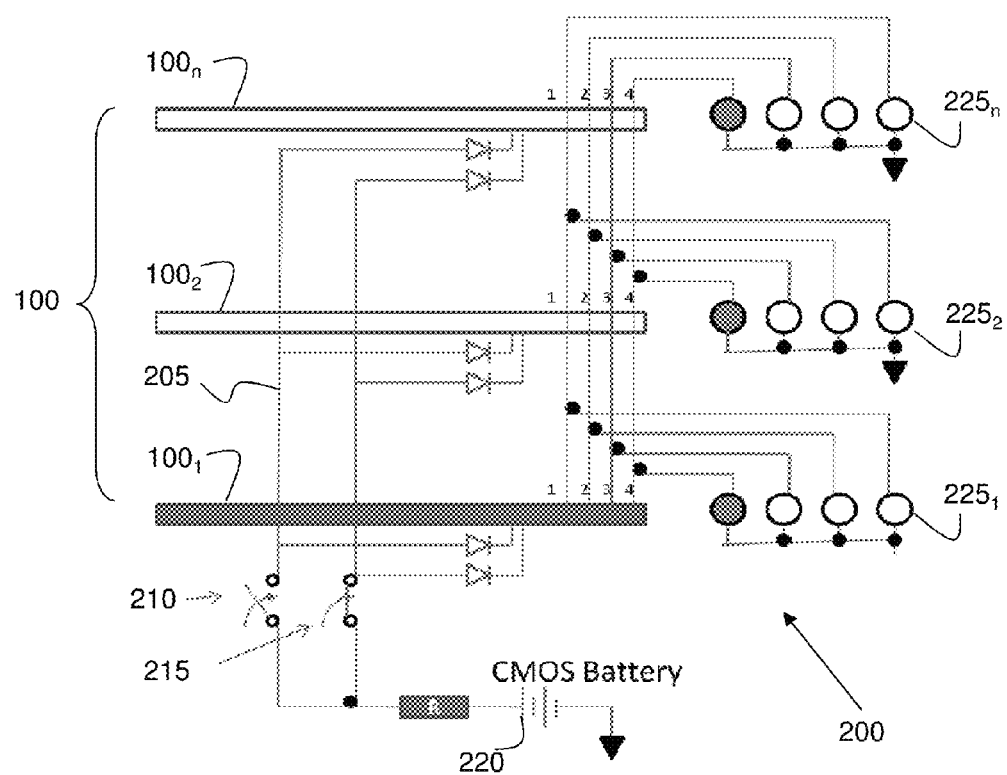
FIG. 3 depicts the memory installation verification system when a second switch is activated and a DIMM is inserted into a memory socket in accordance with aspects of the invention.

Similarly, FIG. 3 depicts the memory installation verification system 10 when the speed switch 215 is activated and a single DIMM is inserted into the memory DIMM socket $100_1$. In this operational state, a single DIMM plugged into the memory DIMM socket $100_1$ will result in an illumination of a single light (of a single color) in each lighting bank $225_1$, $225_2$ and $225_n$, which designates a specific characteristic/parameter (i.e., speed) of the DIMM as shown, for example, in Table 2. Accordingly, by plugging a DIMM into any of the memory sockets $100_1$, $100_2$ and $100_n$, closing one of the switches 210, 215 and applying power to the circuit 200, a single color light in each lighting bank $225_1$, $225_2$ and $225_n$ will illuminate, designating a certain characteristic/parameter of the installed DIMM.

Figure 4:
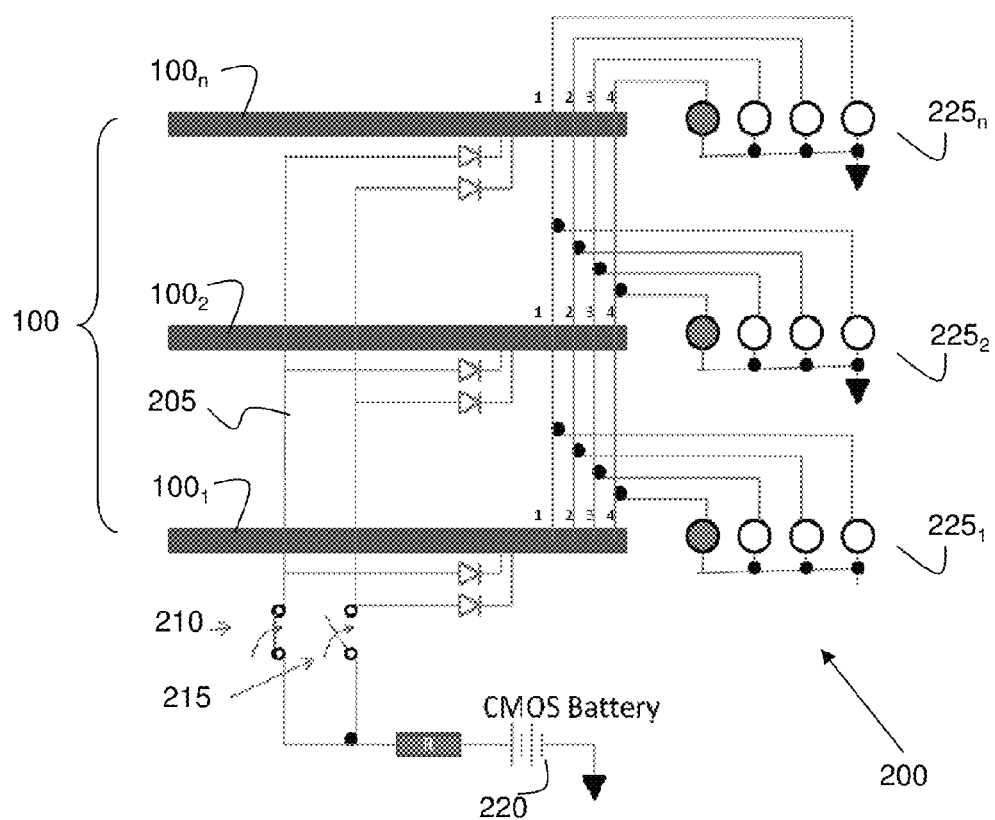
FIG. 4 depicts the memory installation verification system when the first switch is activated and multiple DIMMs of a same type are inserted into different memory sockets of a single memory bank in accordance with aspects of the invention.

FIG. 4 depicts the memory installation verification system 10 when the size switch 210 is activated and multiple DIMMs of a same type, e.g., size, are inserted into each of the memory sockets $100_1$, $100_2$ and $100_n$ of a single memory bank 100. In this operational state, upon powering on the memory installation verification system 10 with the size switch 210 activated, a single light, e.g., same color light, will be illuminated in each respective lighting bank $225_1$, $225_2$ and $225_n$. The illumination of a single light of the same color in each lighting bank $225_1$, $225_2$ and $225_n$ will provide verification that each DIMM in each memory socket 100₁, 100₂ and 100ₙ is of a same type, e.g., same parameters/characteristics.

Figure 5:
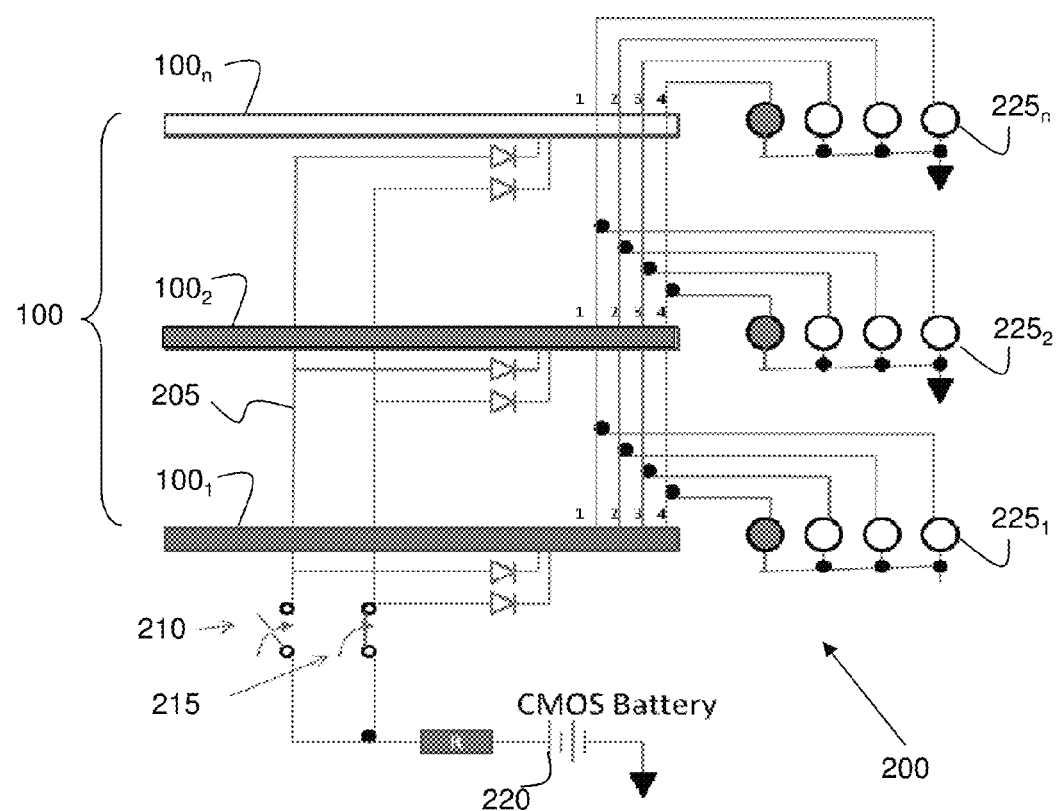
FIG. 5 depicts the memory installation verification system when the second switch is activated and multiple DIMMs of a same type are inserted into different memory sockets of a single memory bank in accordance with aspects of the invention.

Similarly, FIG. 5 depicts the memory installation verification system 10 when the speed switch 215 is activated and multiple DIMMs of a same type, e.g., speed, are inserted into each of the memory sockets 100₁, 100₂ of the single memory bank 100. In this operational state, upon powering on the memory installation verification system 10 with the speed switch 215 activated, a single light, e.g., same color light, will be illuminated in each respective lighting bank 225₁, 225₂ and 225ₙ. The illumination of a single light of the same color in each lighting bank 225₁, 225₂ and 225ₙ will provide verification that each DIMM in each memory socket 100₁, 100₂ is of a same type, e.g. same parameters/characteristics.

Figure 6:
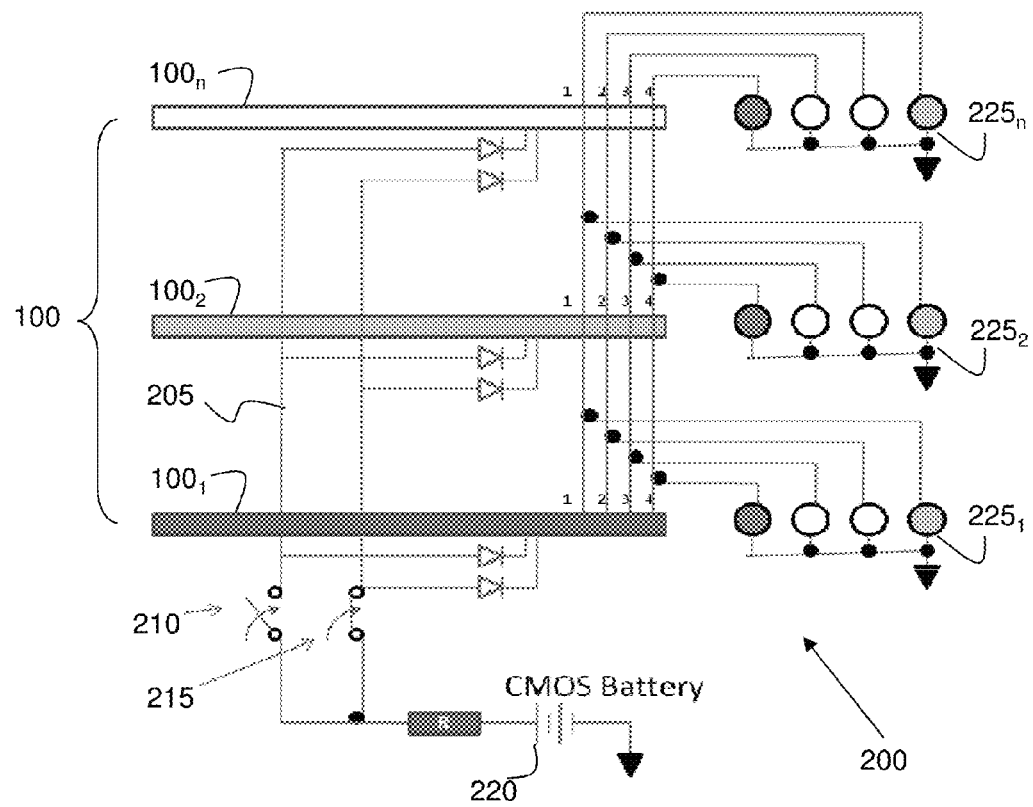
FIG. 6 depicts the memory installation verification system when the other switch is activated and DIMMs of different types are inserted into different memory sockets of a single memory bank in accordance with aspects of the invention.

In comparison to FIG. 5, FIG. 6 depicts the memory installation verification system 10 when the speed switch 215 is activated and DIMMs of a different type, e.g., different speed, are inserted into the memory sockets 100₁, 100₂ of a single memory bank 100. It should be recognized that FIG. 6 (as with FIGS. 2-5) can be representative of other characteristics/parameters of the DIMMs in accordance with aspects of the invention. In the operational state of FIG. 6, upon powering on the memory installation verification system 10 with the speed switch 215 activated, two different lights, e.g., different color lights, will be illuminated in each lighting bank 225₁, 225₂ and 225ₙ. For example, referring to both Table 2 and FIG. 6, it can be determined that the memory speed in the bottom socket 100₁ is 1066 MHz while the memory speed in the middle socket 100₂ is 1666 MHz. Thus, the illumination of different color lights (two different lights) in each lighting bank 225₁, 225₂ and 225ₙ will provide verification that DIMM is of a different type.

By noting such a lighting scheme shown in FIG. 6, e.g., two LEDs being illuminated, the person installing the DIMMs will be notified that an incorrect DIMM has been installed in one of the memory sockets, e.g., there is mismatch of memory DIMMs in one of the memory parameters. This will prompt the person installing the DIMMs to remove the mismatched DIMM and install a DIMM of the same type in the proper memory socket. Upon installation of a new DIMM, verification that a proper DIMM has been installed will be provided when only a single light is illuminated in each lighting bank 225₁, 225₂ and 225ₙ.

Figure 7:
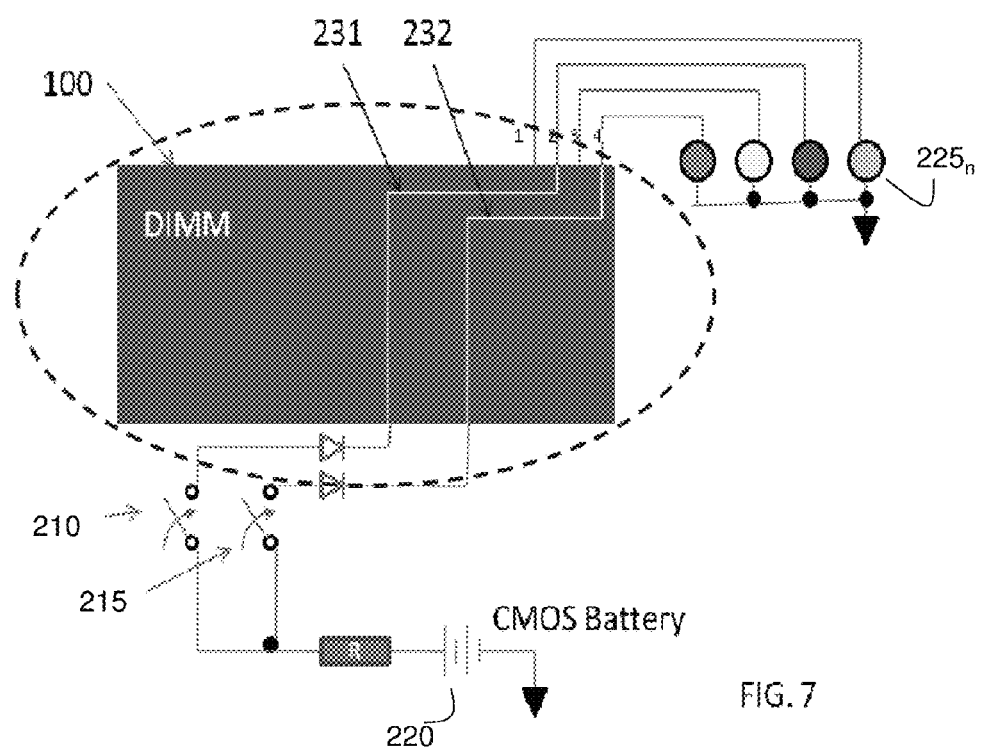
FIG. 7 depicts an implementation of the speed/size circuitry on the DIMM socket, itself, where each DIMM socket includes wiring to identify the DIMM characteristics in accordance with aspects of the invention.

FIG. 7 depicts an implementation of the speed/size circuitry on the DIMM socket, itself, where each DIMM socket includes wiring to identify the DIMM characteristics in accordance with aspects of the invention. Using FIG. 7 as an exemplary illustration to denote the different speed and size parameters, each DIMM socket 100 has wiring to denote the speed 231 and size 232 parameters of the DIMM inserted therein. In embodiments, each DIMM socket 100 has a connection between the edge connector for speed switch 215 and the edge connector for the lighting banks 225₁, 225₂ and 225ₙ. Similarly, each DIMM has a connection between the edge connector for size switch 215 and the edge connector for the lighting banks 225₁, 225₂ and 225ₙ. The wiring for both the speed and size indications are provided in accordance with Tables 1 and 2. It should be noted that other DIMM wiring conventions can be used as noted in Tables 1 and 2 for other DIMM characteristics.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A system, comprising:
    a bank of memory slots comprising a plurality of memory sockets; and
    a circuit comprising wiring connecting at least a first switch and a second switch to each of the memory sockets with direct connections to respective lights within banks of lights respectively associated with each of the plurality of memory sockets,
    wherein, after the first switch is closed and the second switch is open, the circuit will illuminate different lights in each of the banks of lights in accordance with a size of a memory inserted into one of the plurality of memory sockets, and
    after the second switch is closed and the first switch is open, the circuit will illuminate different lights in each of the banks of lights in accordance with a speed of the memory inserted into one of the plurality of memory sockets.

2. The system of claim 1, wherein at least one light in each bank of lights illuminates upon insertion of the memory into a memory socket of the plurality of memory sockets.

3. The system of claim 1, wherein the each light in the bank of lights is grounded.

4. The system of claim 1, wherein the circuit is designed and configured to designate that a dual in-line memory module (DIMM) plugged into a memory socket of the plurality of memory sockets is of a certain type.

5. The system of claim 4, wherein the circuit is designed and configured to illuminate a single light in each of the bank of lights when a DIMM is plugged into the memory socket of the plurality of memory sockets is of the certain type.

6. The system of claim 4, wherein the circuit is designed and configured to verify that multiple DIMMs plugged into multiple memory sockets of the plurality of memory sockets are of a same type.

7. The system of claim 6, wherein the circuit is designed and configured to illuminate a single light in each of the bank of lights when multiple DIMMs plugged into the multiple memory sockets of the plurality of memory sockets are of the same type.

8. The system of claim 6, wherein the circuit is designed and configured to illuminate plural lights in each of the bank of lights when multiple DIMMs plugged into the multiple memory sockets of the plurality of memory sockets are of a different type.

9. The system of claim 8, wherein each light in the bank of lights is of a different color designating a different parameter of a memory plugged into the memory socket.

10. A system comprising:
    a bank of memory slots comprising a plurality of memory sockets; and
    a circuit comprising wiring connecting at least one switch to each of the memory sockets with direct connections to respective lights within a bank of lights associated with each of the plurality of memory sockets,
    wherein the circuit is designed and configured to designate that a dual in-line memory module (DIMM)

plugged into a memory socket of the plurality of memory sockets is of a certain type, wherein each light in the bank of lights is of a different color designating a different parameter of a memory plugged into the memory socket, wherein the circuit is designed and configured to verify that multiple DIMMs plugged into multiple memory sockets of the plurality of memory sockets are of a same type, wherein the circuit is designed and configured to illuminate plural lights in each of the bank of lights when multiple DIMMs plugged into the multiple memory sockets of the plurality of memory sockets are of a different type, and wherein the different parameter is at least a speed of the memory and a size of the memory.

11. The system of claim 1, wherein each light of a same color in each bank of lights is connected to a same wiring and each of the memory sockets.

12. The system of claim 1, wherein the circuit is designed and configured to verify that memory modules of identical size, type, banking and stacking technology, and/or vendor are installed in a server system eliminating any potential functionality issues which can otherwise result in mixed memories installed in the same server system.

13. A system, comprising:
a plurality of memory sockets;
a bank of lights, including at least two different types of lights, adjacent to each of the memory slots of the plurality of memory slots, wherein a first type of light in each bank of lights designates a first type of memory plugged into a memory socket of the plurality of memory sockets, and wherein a second type of light in each bank of lights designates a second type of memory plugged into the memory socket of the plurality of memory sockets; and
a circuit comprising wiring connecting at least one switch to each of the memory sockets with direct connections to each of the lights within the bank of lights, wherein the wiring further connects lights across the bank of lights such that upon insertion of memory into one memory socket of the plurality of memory sockets the first type of light in each of the banks of lights illuminates if the memory is the first type of memory and the second type of light in each of the banks of lights illuminates if the memory is the second type of memory.

14. The system of claim 13, wherein each of the lights in each of the bank of lights designate that a dual in-line memory module (DIMM) plugged into a memory socket of the plurality of memory sockets has certain characteristics or parameters.

15. The system of claim 14, wherein the circuit is designed and configured to verify that multiple DIMMs plugged into multiple memory sockets of the plurality of memory sockets are of a same type by illumination of a single light in each of the bank of lights.

16. The system of claim 14, wherein the circuit is designed and configured to illuminate different lights in each of the bank of lights when multiple DIMMs plugged into the multiple memory sockets of the plurality of memory sockets are of a different type.

17. The system of claim 13, wherein each light of a same color in each bank of lights is connected to a same wiring and each of the memory sockets.

18. The system of claim 13, wherein the circuit is designed and configured to verify that memory modules of identical size, type, banking and stacking technology, and/or vendor are installed in a server system eliminating any potential functionality issues which can otherwise result in mixed memories installed in the same server system.

19. A system, comprising:
a plurality of memory sockets corresponding to a bank of memory;
a plurality of different types of lights adjacent to each memory socket of the plurality of memory sockets, wherein each type of light of the plurality of lights corresponds, respectively, to a different level of a parameter of a memory plugged into each memory socket of the plurality of memory sockets; and
a circuit comprising at least one switch and wiring, the wiring:
connecting the at least one switch to each of the memory sockets;
connecting each of the memory sockets to each of the lights of the plurality of lights adjacent to the memory socket; and
connecting lights across different memory sockets, which designate a same level of the memory parameter,
wherein a particular set of lights, among the plurality of lights adjacent to each memory socket, illuminate when a dual in-line memory module (DIMM) plugged into a memory socket of the plurality of memory sockets has a same level of the memory parameter that matches to the set of lights.

20. The system of claim 19, wherein the circuit is designed and configured to:
verify that multiple DIMMs plugged into multiple memory sockets are of a same type by illumination of a single light adjacent to each of the memory sockets; and
illuminate different lights in each of the bank of lights when multiple DIMMs plugged into the multiple memory sockets are of a different type.

* * * * *